United States Patent
Maupin

(10) Patent No.: US 7,302,010 B2
(45) Date of Patent: Nov. 27, 2007

(54) METHOD FOR HANDLING DATA TRANSMISSIONS WITHIN A MODEM

(75) Inventor: Patrick Evan Maupin, Austin, TX (US)

(73) Assignee: Silicon Laboratories, Austin, TX (US)

(*) Notice: Subject to any disclaimer, the term of this patent is extended or adjusted under 35 U.S.C. 154(b) by 738 days.

(21) Appl. No.: 10/757,650

(22) Filed: Jan. 14, 2004

(65) Prior Publication Data

US 2005/0152470 A1    Jul. 14, 2005

(51) Int. Cl.
   *H04L 27/04* (2006.01)
(52) U.S. Cl. .................................... 375/295; 341/51
(58) Field of Classification Search ............. 375/295, 375/377, 222, 220; 370/276; 455/39, 73, 455/91
   See application file for complete search history.

(56) References Cited

U.S. PATENT DOCUMENTS 5,686,912 A * 11/1997 Clark et al. ................. 341/51
6,271,775 B1 * 8/2001 Jaquette et al. ............. 341/87
6,289,130 B1 * 9/2001 Cooklev ..................... 382/232

* cited by examiner

*Primary Examiner*—David C. Payne
*Assistant Examiner*—Leon Flores
(74) *Attorney, Agent, or Firm*—Anthony P. Ng; Dillon & Yudell LLP

(57) ABSTRACT

A method for handling data transmissions within a modem is disclosed. A codeword is generated by compressing one or more incoming characters. The incoming characters and codeword are subsequently stored in a buffer. Then, a cost difference between transmitting all the codewords previously stored in the buffer and transmitting all the characters previously stored in the buffer is updated based on the most recent codeword. If the determined cost difference is less than a low limit value, the characters previously stored in the buffer are transmitted. However, if the determined cost difference is greater than a high limit value, the codewords previously stored in the buffer are transmitted. Otherwise, if the determined cost difference falls inclusively between the low limit value and the high limit value, transmission of the buffered data is deferred until the cost difference is recalculated on the next codeword.

20 Claims, 2 Drawing Sheets

METHOD FOR HANDLING DATA TRANSMISSIONS WITHIN A MODEM

BACKGROUND OF THE INVENTION

1. Technical Field

The present invention relates to data communications in general, and in particular to data communications utilizing modems. Still more particularly, the present invention relates to a method for handling data transmissions within a modem.

2. Description of Related Art

The use of an analog modulator-demodulator (modem) to transmit digital signals across an analog channel, such as a telephone line, is well known in the art. Typically, an analog modem transmits data from a local asynchronous data terminal equipment (DTE) to a remote asynchronous DTE at the data rate of the modem's analog channel. In addition, a compression scheme is commonly utilized within a modem for storing and transmitting data in a reduced data format such that data can be communicated more efficiently. In order to compress data, a selected portion of the data must be accumulated initially. Then, the data are compressed to a selected codeword combination. When the compressed data is received at a receiving modem, the selected codeword combination is subsequently decompressed to yield the original data.

A compression scheme promulgated by the International Telecommunications Union (ITU) for data communications over a telephone network is known as the V.42bis standard, the pertinent of which is incorporated herein by reference. The compression scheme under the V.42bis standard includes two transmission modes: a transparent mode and a compressed mode. There are commands that can be sent to a decoder in both transmission modes for mode switching. For example, when in the transparent mode, a two-character sequence, which begins with a special escape character followed by an ECM (i.e., enter compression mode) command, instructs the decoder to switch to the compressed mode. When in the compressed mode, an ETM (i.e., enter transparent mode) command instructs the decoder to switch to the transparent mode.

The present invention provides a method for handling data transmissions within a modem that is operating under the V.42bis standard.

SUMMARY OF THE INVENTION

In accordance with a preferred embodiment of the present invention, a codeword is generated by compressing one or more incoming characters. The incoming characters and codeword are subsequently stored in a buffer. Then, a cost difference between transmitting all the characters previously stored in the buffer and transmitting all the codewords previously stored in the buffer is determined. If the determined cost difference is less than a low limit value, the characters previously stored in the buffer are transmitted. However, if the determined cost difference is greater than a high limit value, the codewords previously stored in the buffer are transmitted. Otherwise, if the determined cost difference falls inclusively between the low limit value and the high limit value, transmission of the data in the buffer is deferred until the cost difference is recalculated on the next codeword.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
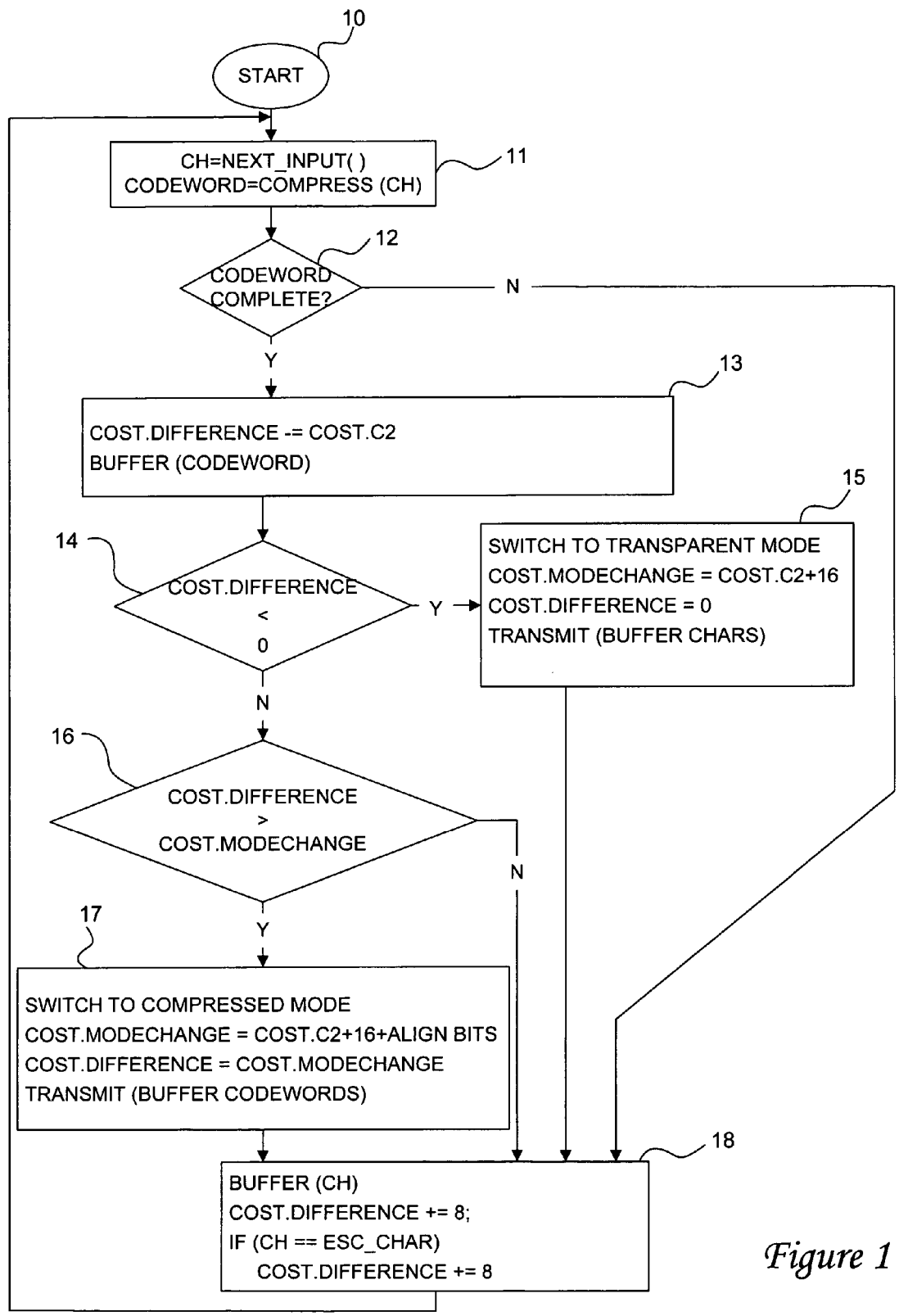
FIG. 1 is a high-level logic flow diagram of a method for handling data transmissions within a modem, in accordance with a preferred embodiment of the present invention.

Generally speaking, the compression ratio achieved by a compression algorithm depends on the data compressibility. If the data in question is not compressible, the compression algorithm not only does not provide compression but may lead to data expansion instead. Hence, when a modem is confronted with a group of highly incompressible data, it is advantageous for the modem to transmit the incoming data without any compression at all. Otherwise, the incoming data should be compressed by a compression algorithm within the modem before transmission in order to achieve a higher transmission efficiency. As such, it is important for an encoder within a modem to correctly decide whether uncompressed or compressed data should be transmitted.

The V.42bis standard, which is promulgated by the International Telecommunications Union (ITU) for data transmissions over a telephone network, includes two transmission modes—a transparent mode and a compressed mode. Under the V.42bis standard, uncompressed data are being transmitted during the transparent mode, and compressed data are being transmitted during the compressed mode. While the V.42bis standard defines most of its implementation requirements, many aspects of the standard are not clearly specified. For example, the V.42bis standard does not specify when and how an encoder may decide to switch from a transparent mode to a compressed mode and vice versa. As a result of such ambiguity and under-specification, modems with different implementations of the V.42bis standard can have varying levels of compression efficiency. Be that as it may, since the V.42bis standard does not constrain when an encoder can switch between transmission modes, there is ample room for improving data transmission efficiency by making intelligent mode selections at the most opportune time.

One prior art implementation of the V.42bis standard include two buffers, one with uncompressed data and the other with compressed data. When one of the buffers is filled up, a decision (or guess) is made as to whether it is more efficient to transmit the uncompressed data or the compressed data from their respective buffer in a corresponding transmission mode. But such implementation does not always guarantee optimal transmission efficiency for all data at all times because of the size arbitrariness of the buffer.

In accordance with a preferred embodiment of the present invention, a mode selection decision is made on a per codeword basis. Specifically, for each codeword, the codeword and corresponding transparent characters are stored in a buffer and then a decision is made as to whether the most efficient transmission mode can be conclusively determined or there is insufficient information to conclude if it would be more efficient to send the buffered codewords in a compressed mode or their corresponding characters in a transparent mode. In the former case, a transmission mode selection is made and all previously buffered data for the chosen transmission mode are sent via the chosen transmission mode. In the latter case, the codeword along with the associated characters are left in the buffer until more information is available.

A cost model is utilized to assist the above-mentioned decision making process. The cost model includes a cost difference, a low limit value and a high limit value. Preferably, the low limit value is set at 0, and the high limit value is set at the cost (in bits) of switching to the compressed mode and back to the transparent mode. If the cost difference of all buffered codewords is less than the low limit value, the cost model can conclude that it is more beneficial to send buffered characters in the transparent mode. If the cost difference of all buffered codewords is greater than the high limit value, the cost model can conclude that it is more beneficial to send buffered codewords in the compressed mode. If the cost difference falls inclusively between the low and the high limit values (i.e., greater than the low limit value but less than the high limit value or equal to one of the limit values), the cost model cannot conclusively decide which transmission mode to use to send buffered data, and the codewords along with their associated characters will be left in the buffer pending for a subsequent decision.

Referring now to the drawings and, in particular, to FIG. 1, there is depicted a high-level logic flow diagram of a method for handling data transmissions within a modem, in accordance with a preferred embodiment of the present invention. Starting at block 10, an incoming character is initially received by an encoder within a modem, and the incoming character is compressed to yield a codeword, as shown in block 11. A determination is then made as to whether or not the codeword has been completed, as depicted in block 12. If the codeword has not been completed, the incoming character is sent to a buffer, as depicted in block 18. Otherwise, if the codeword has been completed, a cost difference (i.e., cost.difference) is updated and the codeword is sent to the buffer, as shown in block 13. Cost.C2 is the current number of bits per codeword, as defined in the V.42bis standard.

Next, a determination is made as to whether or not the cost difference is less than the low limit value (which is preferably set to 0), as depicted in block 14. If the cost difference is less than the low limit value, then the transmission mode is set to the transparent mode, the high limit value (i.e., cost.modechange or the transmission cost of switching to the compressed mode and back) is calculated, the cost difference is set to zero, and the character(s) previously stored in the buffer is transmitted via the transparent mode, as shown in block 15. Otherwise, if the cost difference is greater than the low limit value, then another determination is made as to whether or not the cost difference is greater than the high limit value, as depicted in block 16. If the cost difference is not greater than the high limit value, then the incoming character is sent to the buffer, as depicted in block 18. Otherwise, if the cost difference is greater than the high limit value, then the transmission mode is set to the compressed mode, a new high limit value is calculated, the cost difference is set to the new high limit value, and the codeword(s) previously stored in the buffer is transmitted via the compressed mode, as shown in block 17. After the incoming character has been sent to the buffer, and the cost difference has been incremented (by sixteen if the incoming character is an escape character, or by eight otherwise), as depicted in block 18, the process returns to block 11 to receive a new character.

When the cost difference falls inclusively between the low limit value and the high limit value (i.e., the no decision path for block 16 in FIG. 1), the cost difference is in a "transition region" and the goal is to leave the transition region such that a mode selection decision can be reached as soon as practical. If the cost difference is in the transition region and the modem needs to be flushed, the current transmission mode can be utilized to send the corresponding data previously stored in the buffer because when there is no more data to be sent, saving a few bits is not worth any real effort to come up with a mode selection decision. Of course, a flush operation should only be initiated when there is no more data to send to the far side, and it is used to insure that all previously compressed data is output to the receiving modem. Thus, an alternative method is to always switch to the transparent mode when the modem needs to be flushed. Such strategy allows the most efficient compressor operation because compressed strings are not broken at arbitrary boundaries.

If the cost difference is in the transition region and the modem does not need to be flushed, the most efficient method is to hold off on deciding which transmission mode to use to send the current data, and see if the immediate subsequent data-to-send changes the cost difference sufficiently to take the cost difference out of the transition region. In order to support the delay on decision making, a relatively large buffer is required. The present invention operates most efficiently if the buffer for storing codewords and their corresponding characters is large enough such that it will never be filled up. However, there are several options that can be taken if the buffer happens to be filled up. A buffer of 1024 words can hold, for example, at least 512 uncompressed bytes. Even if a wrong transmission mode selection is made, the highest cost to get back to the correct transmission mode is approximately 16 bits (could be a little more when switching from the compressed mode to the transparent mode), which means the penalty for making a wrong transmission mode decision would be at most 16/(512×8) or approximately 0.4% of the data where the best transmission mode is inconclusive. In practice, runs of inconclusive data do not usually last that long, and the buffer size can be made much smaller without significantly impacting the compression ratio on most types of data.

When the buffer does fill up, even though there is no clear-cut answer as to whether it is more beneficial to use the compressed mode or the transparent mode to send the corresponding data, at least some data must be sent. The following are options for dealing with a full buffer:

(1) Simply use the current transmission mode to send the entire group of the corresponding data in the buffer. If the buffer is substantially large, this option will not be very detrimental to the overall compression ratio.

(2) Check the current cost difference and use whatever transmission mode that yields the lowest cost at the present time to send the entire group of corresponding data in the buffer.

(3) Check the current cost difference and select a transmission mode based on the current cost difference and other heuristic information (such as the current transmission mode or transparent/compressed history information) to send the entire group of corresponding data in the buffer. If there is no more data coming into an encoder, this option will perform worse than option (2). But when there are more data coming into the encoder, the overall throughput may be increased.

(4) Use the current transmission mode to send a portion of the corresponding data in the buffer, recalculate the current cost difference for the remaining data in the buffer, and hold off on sending the remaining data in the buffer until the cost difference is no longer in the transition region or the buffer fills up again.

In general, option (4) is the most complex, especially if the modem is attempting to maintain a highly accurate cost model. Each character requires 8 or 16 bits to transmit, depending on whether it is an escape code or not, and any particular codeword may require more bits to transmit than the previous one (because of a step up in the codeword size). This means that the additional information must be buffered along with the characters and the codewords, or they must be reconstructed whenever a portion of the corresponding data in the buffer has been transmitted. It also means that the encoder must have a method to determine an intermediate point in the buffer to indicate when to stop sending data. For options (1)-(3), once the encoder decides to transmit the data from the buffer, the encoder can output the entire group of data stored in the buffer before accepting any more data into the buffer.

The following are some examples for illustrating a preferred embodiment of the present invention. The examples assume a codeword size of 10 bits. Each codeword encodes one or more 8-bit characters (the number of characters represented is a function of the compressibility of the source data and a function of how the V.42bis dictionary works). Also, switching from the transparent mode to the compressed mode (i.e., ESC character followed by ECM character) costs 16 bits, and switching from the compressed to the transparent mode (i.e., ETM codeword) costs 10 bits plus the number of bits it takes to become byte-aligned.

EXAMPLE 1

Assume the encoder is currently in the transparent mode. The next 10-bit codeword to be sent encodes a single 8-bit character. Result: The eight bits are transmitted immediately because there is no possible benefit in switching to the compressed mode and then sending ten bits instead of sending eight bits in the transparent mode.

EXAMPLE 2

Assume the encoder is currently in the compressed mode. The next codeword to be sent encodes two 8-bit characters. Result: The 10-bit codeword is transmitted immediately because there is no possible benefit in switching to the transparent mode and then sending sixteen bits instead of ten bits in the compressed mode.

EXAMPLE 3

Assume the encoder is currently in the transparent mode. The next codeword to be sent encodes six 8-bit characters. Result: The encoder switches to the compressed mode, and then transmits the current codeword in the compressed mode. This is demonstrably the most efficient course of action even if the codewords immediately following the current codeword are better sent in the transparent mode, because it will cost less to switch to the compressed mode (16 bits) send the current codeword (10 bits) switch back (10 bits) and realign to a byte boundary (4 bits) than it will cost to stay in the transparent mode and output the six transparent bytes (40 bits verse 48 bits).

EXAMPLE 4

Assume the encoder is currently in the transparent mode. The next codeword to be sent encodes four 8-bit characters. Result: The encoder should do nothing until it has more data, because it does not have enough information to know which transmission mode the current data should be sent in. This is because if the encoder were to stay in the transparent mode, it would take 32 bits to send the data, but if the encoder were to switch to the compressed mode to send the data, it would only take 26 bits (16 bits to switch to the compressed mode, and 10 bits to send subsequent data). However, if subsequent data were not compressible, the encoder would have to switch back to the transparent mode to send the subsequent data, which would cost another 14 bits (10 bits to switch back, plus 4 bits to align to a byte boundary) for a net loss of 8 bits.

EXAMPLE 5

Assume that the encoder has buffered and not yet sent a codeword that encodes four 8-bit characters, as in Example 4, and the next codeword to be sent encodes two 8-bit characters. At this point, it would cost the same amount, 48 bits, to transmit the data in transparent mode (six 8-bit characters) as in compressed mode (16 bits to switch to the compressed mode, 20 bits to send two 10-bit codewords, and 12 bits to switch back to the transparent mode (10+2 alignment bits)). At this point, there are three options:
  a) Simply output data in the transparent mode. This will not be optimal if the codeword following these two is better sent in the compressed mode.
  b) Simply output data in the compressed mode. This will send the optimal number of bits in any case, but may incur an extra two mode transitions (if the codewords following these two are best sent in the transparent mode). For various efficiency reasons for both the encoder and decoder, it may be useful to reduce the number of mode transitions.
  c) Delay until more data to yield a clear-cut answer. This will send the optimal number of bits unless the buffer fills up because of such indecisiveness. This may be the best option unless the buffer is very small or unless it is more desirable to reduce buffering as much as possible for latency reasons.

Option (c) is the one used by the preferred embodiment shown in FIG. 1. One skilled in the art could choose one of the other options as desired by changing the calculation of the limit values and/or by using "<=" and ">=" in preference to "<" and ">" in the comparisons in FIG. 1.

EXAMPLE 6

Assume the same situation as in Example 5, except that the next codeword to be sent encodes three 8-bit characters, instead of two 8-bit characters. Result: Switch to the compressed mode and send the two codewords corresponding to the seven transparent bytes. This is because even if the encoder has to switch back to the transparent mode immediately, sending codewords in the compressed mode costs only 48 bits (verses 56 bits in transparent mode).

Figure 2:
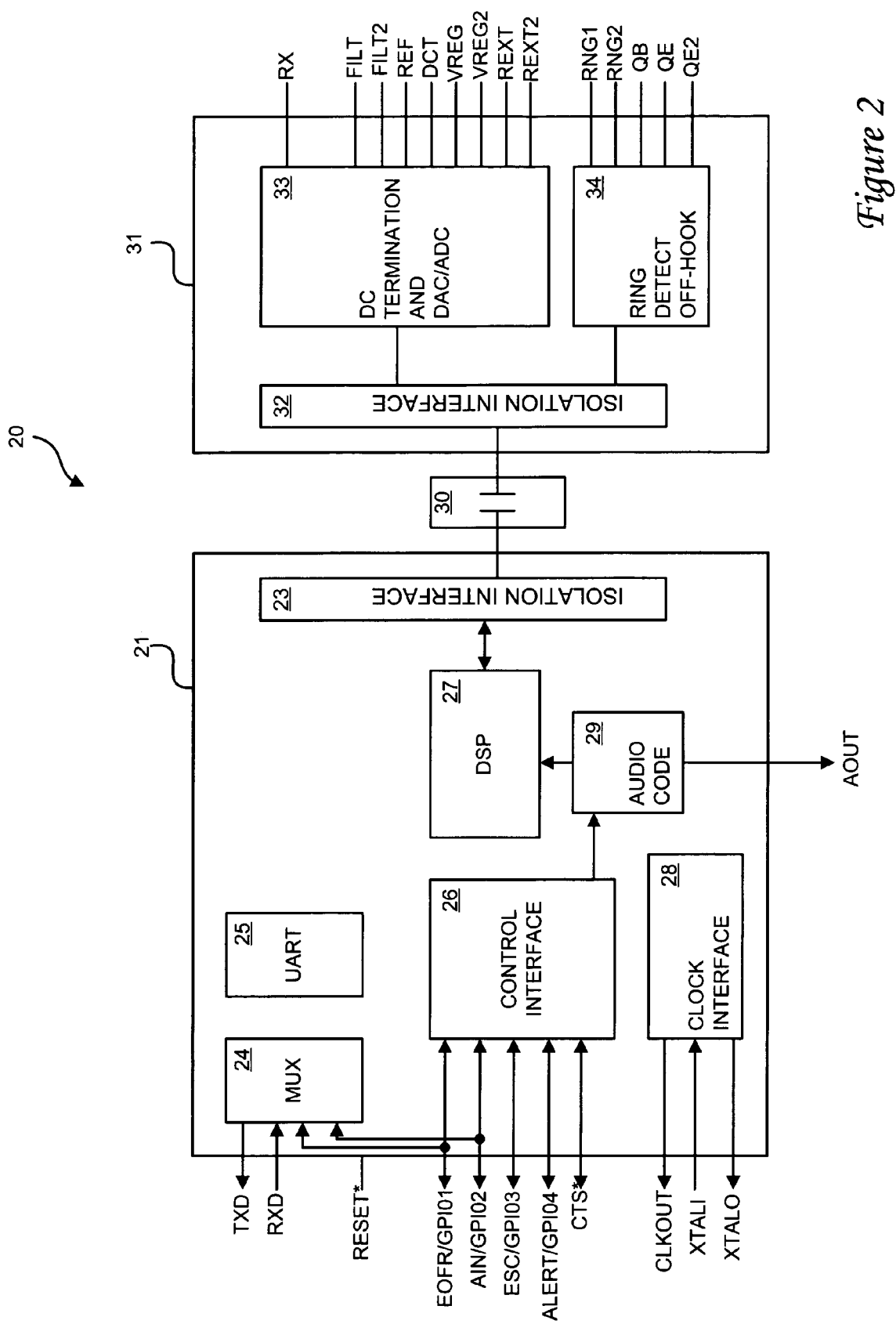
FIG. 2 is a block diagram of a modem in which a preferred embodiment of the present invention can be incorporated.

With reference now FIG. 2, there is depicted a block diagram of a modem in which a preferred embodiment of the present invention can be incorporated. As shown, modem 20 includes a system-side line-isolation module 21 and a line-side line-isolation module 31. System-side line-isolation module 21 and line-side line-isolation module 31 are coupled to each other via an isolation barrier 30 such as a capacitor. System-side line-isolation module 21 includes an isolation interface 23, a multiplexer 24, an universal asynchronous receiver transmitter (UART) 25, a control interface 26, a digital signal processor (DSP) 27, a clock interface 28, and an audio coder-decoder (CODEC) 29.

System-side line-isolation module 21 includes a transmit pin TXD, a receive pin RXD, a reset pin RESET*, a clear-to-send pin CTS*, a clock output pin CLKOUT, crystal oscillator pins XTALI and XTALO, and an analog output pin AOUT. System-side line-isolation module 21 also includes four general purpose programmable input/output pins GPIO1, GPIO2, GPIO3, and GPIO4. Each of the above-mentioned four general purpose programmable input/output pins may be set up as analog in, digital in, or digital out pins, depending on user programming of pin functionality. For example, the GPIO1 pin may also function as an end of frame pin EOFR. The GPIO2 pin may provide an analog in pin AIN. The GPIO3 pin may function as an escape pin ESC for controlling command or data modes. The GPIO4 pin may function as an alert pin ALERT for signaling events such as an intrusion event.

UART 25 converts parallel bytes from DSP 27 into serial bits for transmission to and receipt from an external device through the transmit pin TXD and the receive pin RXD, respectively. In addition to signal processing, DSP 27 also functions as a data pump and provides AT command decoding. Clock interface 28 includes a clock generator and generates all the modem sample rates for supporting the modem standards designed into system-side line-isolation module 21.

Line-side line-isolation module 31 includes an isolation interface 32, a hybrid circuit 33 and a ring detect and off-hook circuit 34. Hybrid circuit 33 may include a DC termination circuit as well as an analog-to-digital converter (ADC) circuit and a digital-to-analog converter (DAC) circuit. Line-side line-isolation module 31 includes a receive input pin RX, filter pins FILT and FILT2, a reference pin REF, a DC termination pin DCT, voltage regulation pins VREG and VREG2, external resistor pins REXT and REXT2, ring pins RNG1 and RNG2 and transistor connection pins QB, QE and QE2.

Filter pins FILT and FILT2 set the time constant for the DC termination circuit. The reference pin REF may be connected to an external resistor to provide a high accuracy reference current. The DC termination pin DCT provides DC termination for a telephone phone line and an input for voltage monitors. Voltage regulation pins VREG and VREG2 may be connected to external capacitors to provide a bypass internal power supply. External resistor pins REXT and REXT2 provide real and complex AC termination. Ring pins RNG1 and RNG2 may be connected through capacitors to "tip" and "ring" to provide ring and caller ID signals across isolation barrier 30. Transistor connection pins QB, QE and QE2 may be connected to external bipolar hook-switch transistors.

As has been described, the present invention provides a method for determining optimal switching between transmission modes, such as transparent and compressed modes, when transmitting data within a modem that is operating under the V.42bis standard.

While the invention has been particularly shown and described with reference to a preferred embodiment, it will be understood by those skilled in the art that various changes in form and detail may be made therein without departing from the spirit and scope of the invention.

What is claimed is:

1. A method for handling data transmissions, said method comprising:
   generating a codeword by compressing one or more incoming characters;
   storing said codeword and said one or more incoming characters in a buffer;
   determining a cost difference between transmitting all codewords previously stored in said buffer and transmitting all characters previously stored in said buffer;
   in response to said determined cost difference being less than a low limit value, transmitting all characters previously stored in said buffer;
   in response to said determined cost difference being greater than a high limit value, transmitting all codewords previously stored in said buffer; and
   in response to said determined cost difference being inclusively between said low limit value and said high limit value, deferring data transmission from said buffer.

2. The method of claim 1, wherein said method is implemented within a modem operating under the V.42bis standard.

3. The method of claim 2, wherein said transmitting all characters previously stored in said buffer further includes transmitting all characters previously stored in said buffer via a transparent mode.

4. The method of claim 2, wherein said transmitting all codewords previously stored in said buffer further includes transmitting all codewords previously stored in said buffer via a compressed mode.

5. The method of claim 1, wherein said low limit value is initially set to zero.

6. The method of claim 1, wherein said high limit value is set at a cost in bits for switching to a compressed mode and back to a transparent mode under the V.42bis standard.

7. The method of claim 1, wherein said deferring further includes deferring data transmission until a new cost difference is determined based on a subsequent codeword.

8. The method of claim 1, wherein said deferring further includes deferring data transmission until said buffer becomes full.

9. The method of claim 1, wherein said deferring further includes deferring data transmission until data is required to be flushed out of said buffer.

10. The method of claim 1, wherein said method further includes incrementally updating said cost difference as codewords and characters are sent to said buffer.

11. An apparatus for handling data transmissions, said apparatus comprising:
    means for generating a codeword by compressing one or more incoming characters;
    means for storing said codeword and said one or more incoming characters in a buffer;
    means for determining a cost difference between transmitting all codewords previously stored in said buffer and transmitting all characters previously stored in said buffer;
    means for transmitting all characters previously stored in said buffer, in response to said determined cost difference being less than a low limit value;
    means for transmitting all codewords previously stored in said buffer, in response to said determined cost difference being greater than a high limit value; and means for deferring data transmission from said buffer, in response to said determined cost difference being inclusively between said low limit value and said high limit value.

12. The apparatus of claim 11, wherein said apparatus is a modem operating under the V.42bis standard.

13. The apparatus of claim 12, wherein said means for transmitting all characters previously stored in said buffer further includes means for transmitting all characters previously stored in said buffer via a transparent mode.

14. The apparatus of claim 12, wherein said means for transmitting all codewords previously stored in said buffer further includes means for transmitting all codewords previously stored in said buffer via a compressed mode.

15. The apparatus of claim 11, wherein said low limit value is initially set to zero.

16. The apparatus of claim 11, wherein said high limit value is set at a cost in bits for switching to a compressed mode and back to a transparent mode under the V.42bis standard.

17. The apparatus of claim 11, wherein said means for deferring further includes means for deferring data transmission until a new cost difference is determined based on a subsequent codeword.

18. The apparatus of claim 11, wherein said means for deferring further includes means for deferring data transmission until said buffer becomes full.

19. The apparatus of claim 11, wherein said means for deferring further includes means for deferring data transmission until data is required to be flushed out of said buffer.

20. The apparatus of claim 11, wherein said apparatus further includes means for incrementally updating said cost difference as codewords and characters are sent to said buffer.

* * * * *